(12) United States Patent
Pramanick et al.

(10) Patent No.: US 6,380,625 B2
(45) Date of Patent: *Apr. 30, 2002

(54) SEMICONDUCTOR INTERCONNECT BARRIER AND MANUFACTURING METHOD THEREOF

(75) Inventors: Shekhar Pramanick, Fremont; Takeshi Nogami, Sunnyvale, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,976

(22) Filed: Jan. 13, 1999

(51) Int. Cl.$^7$ .......................................... H01L 21/4763
(52) U.S. Cl. ..................... 257/751; 257/752; 257/760; 257/530; 438/624; 438/633
(58) Field of Search ............................... 257/751, 760, 257/758, 530, 635, 775, 752; 438/624, 633, 637, 671, 926, 970

(56) References Cited

U.S. PATENT DOCUMENTS

| | | | |
|---|---|---|---|
| 4,933,743 A | 6/1990 | Thomas et al. ................ 357/71 |
| 4,985,750 A | 1/1991 | Hoshino ........................ 357/71 |
| 5,274,485 A | 12/1993 | Narita et al. .................... 359/58 |
| 5,313,100 A | * 5/1994 | Ishii et al. ..................... 257/751 |
| 5,525,837 A | 6/1996 | Choudhury ................... 257/751 |
| 5,635,763 A | * 6/1997 | Inoue et al. ................... 257/763 |
| 5,693,563 A | * 12/1997 | Teong .......................... 437/190 |
| 5,705,849 A | 1/1998 | Zheng et al. ................. 257/530 |
| 5,714,418 A | 2/1998 | Bai et al. ...................... 438/627 |
| 5,739,579 A | 4/1998 | Chiang et al. ................ 257/635 |
| 5,892,282 A | * 4/1999 | Hong et al. ................... 257/751 |
| 5,893,752 A | 4/1999 | Zhang et al. ................. 438/687 |
| 5,939,788 A | 8/1999 | McTeer ........................ 257/751 |
| 5,990,011 A | 11/1999 | McTeer ........................ 438/692 |
| 6,016,011 A | 1/2000 | Cao et al. ..................... 257/773 |
| 6,030,896 A | 2/2000 | Brown ......................... 438/687 |
| 6,057,237 A | 5/2000 | Ding et al. ................... 438/687 |
| 6,077,775 A | 6/2000 | Stumborg et al. ............ 438/643 |
| 6,093,966 A | * 7/2000 | Venkatraman et al. ....... 257/751 |

OTHER PUBLICATIONS

Kyung–Hoon Min et al. "Comparative study of tantalum and tantalum nitrides ($Ta_2N$ and TaN) as a diffusion barrier for Cu metallization", J. Vac. Sci. Technol. B 14(5) pp. 3263–3269, Sep. 1996.

Bhola Mehrontra et al. "Properties of direct current magnetron reactively sputtered TaN", J. Vac. Sci. Technol. B 5(6) pp. 1736–1740, Nov. 1987.

* cited by examiner

Primary Examiner—Matthew Smith
Assistant Examiner—Renzo N. Rocchegiani
(74) Attorney, Agent, or Firm—Mikio Ishimaru

(57) ABSTRACT

A semiconductor interconnect barrier between channels and vias is provided which made of a metallic barrier material. In one embodiment, a first channel is conventionally formed in the semiconductor dielectric, lined with a first barrier material, and filled with a first conductive material. A layer of titanium nitride is formed atop the first channel of the first conductive material. Thereafter, a second channel is conventional formed in a second channel oxide, lined with a second barrier material. The second barrier material is selected from metals such as tantalum, titanium, tungsten, compounds thereof, alloys thereof, and combinations thereof. The combination of the titanium nitride layer and the second barrier material provide a superior barrier for conductive material layers, such as, copper/copper layers, and copper/aluminum layers.

6 Claims, 2 Drawing Sheets

SEMICONDUCTOR INTERCONNECT BARRIER AND MANUFACTURING METHOD THEREOF

CROSS-REFERENCE TO RELATED APPLICATION

The present application contains subject matter related to co-pending U.S. patent application Ser. No. 09/132,562 by Takeshi Nogami, Susan Chen, and Shekhar Pramanick entitled "PAD STRUCTURE FOR COPPER INTERCONNECTION AND ITS FORMATION". The related application is also assigned to Advanced Micro Devices, Inc.

TECHNICAL FIELD

The present invention relates generally to semiconductors and more specifically interconnect barrier materials.

BACKGROUND ART

While manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as channel barrier materials for copper.

According to conventional practices, a plurality of conductive layers are formed over a semiconductor substrate, and the uppermost conductive layer joined to a bonding pad for forming an external electrical connection. The upper conductive layers are typically reserved for power supply lines. The upper conductive layers carry a lot of current and dissipate a substantial amount of the power consumed by the integrated circuit. Therefore, it will be beneficial to use a metalization material with a lower resistance, such as copper, for the upper conductive layers. Accordingly, during the transition from aluminum to copper, it is quite common for an integrated circuit to have one or more of the upper conductive layers formed using copper as the metalization material, while the remaining lower conductive layers are formed using aluminum as the metalization material. The connection of a copper layer with an aluminum layer presents a dissimilar metal potential for electro-migration or interdiffusion. Thus, a suitable barrier layer is needed between the copper layer and the aluminum layer.

However, even with the various types of barrier layers, copper is still subject to strong electro-migration, or movement of copper atoms under current, which can lead to voids in the copper channels and vias. Copper also has poor surface adhesion. A solution, which would form an improved barrier layer between copper and various materials, including dielectrics and aluminum, and with better surface adhesion to reduce electro-migration, has been long sought. As the semiconductor industry is moving from aluminum to copper and other type of materials in order to obtain higher semiconductor circuit speeds, it is becoming more pressing that a solution be found.

DISCLOSURE OF THE INVENTION

The present invention provides a semiconductor interconnect barrier between channels and vias, and a manufacturing method therefor. The barrier material provides a better barrier between metal layers and an improved surface adhesion for the metal layers.

The present invention further provides a semiconductor interconnect barrier between channels and vias selected from tantalum, titanium, tungsten, compounds thereof, alloys thereof, and combinations thereof, formed atop a titanium nitride layer.

The present invention further provides a method of manufacturing semiconductor interconnect barriers between channels and vias of any desired material.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
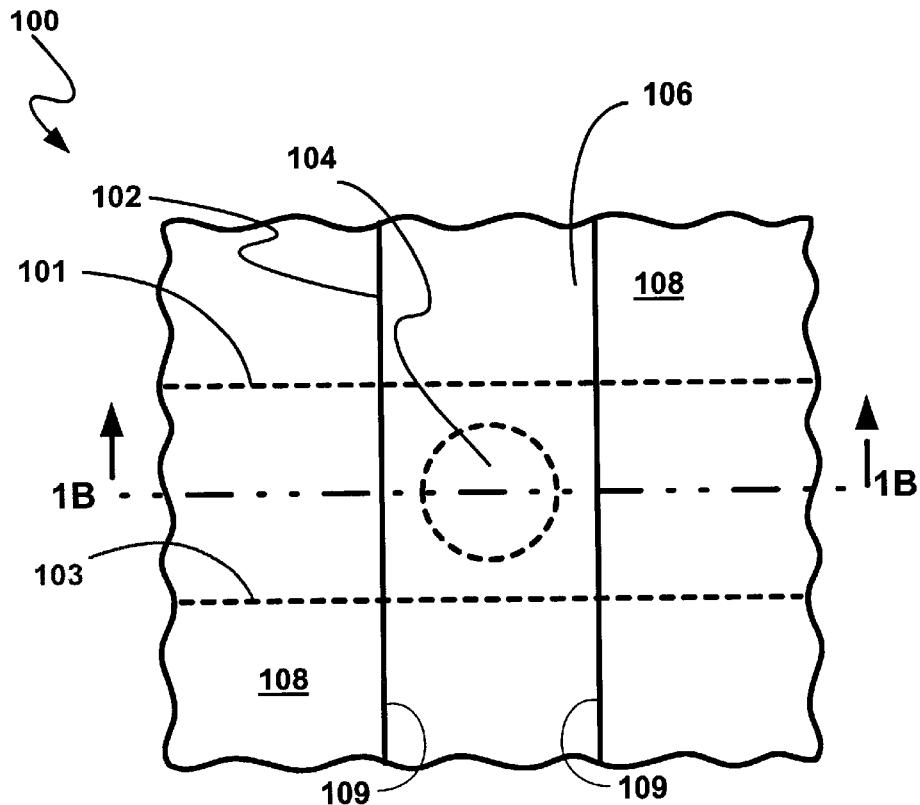
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 contains a first conductive material. The second channel 102 is formed by filling a second channel opening 106 disposed in a second channel oxide layer 108 with a second conductive material. The oxide layers are generally of silicon dioxide ($SiO_2$). The second channel opening 106 is defined by walls (sidewalls) 109 of the second channel dielectric 108.

Figure 1B:
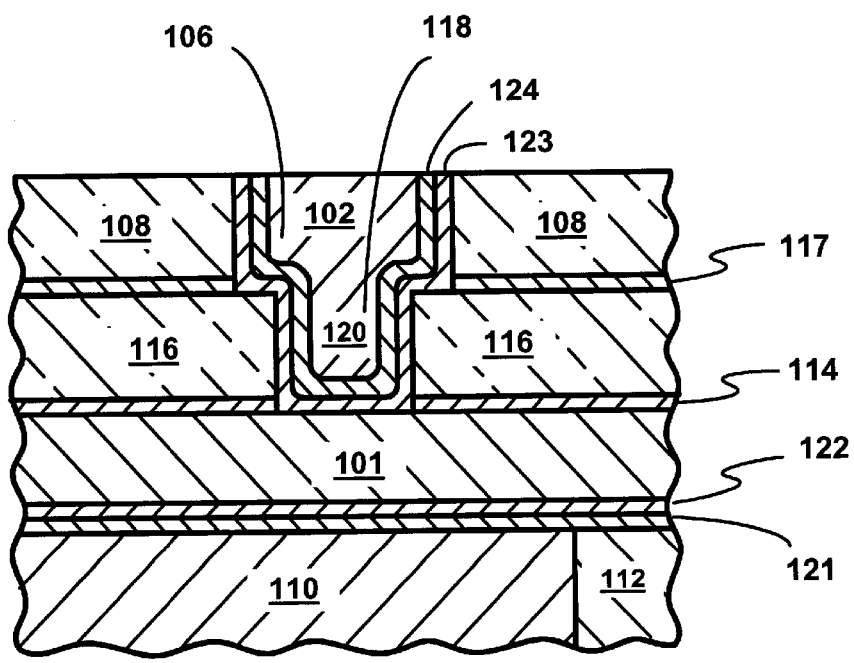
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The conventional nitride layer is composed of a compound of silicon nitride (SiN). The cross-sectional area of the round via 104 of FIG. 1A (PRIOR ART) defines a cylindrical via 120 when it is filled with the second conductive material.

Also shown disposed around the first channel 101 is a barrier layer 121, a seed layer 122 and around the second channel 102 and the cylindrical via 120 is a barrier layer 123 and a seed layer 124. The barrier layers 121 and 123 include barrier material combinations such as titanium/titanium nitride and tantalum/tantalum nitride for copper seed layers, copper, copper alloy, aluminum seed layers, aluminum, or aluminum alloy conductive materials.

However, even with the various types of barrier layers, copper is still subject to strong electro-migration, or movement of copper atoms under current which can lead to voids in the copper channels and vias. Additional problems arise when channel 101 is filled with aluminum while via 120 and channel 102 is filled with copper. Interdiffusion or electro-migration of copper and aluminum lead to formation of a high resistance compound which may cause the integrated circuit to fail. In addition, copper also has poor surface adhesion.

The present invention provides an improved barrier layer between copper and various materials, including dielectrics and aluminum, and with better surface adhesion to reduce electro-migration.

Figure 2:
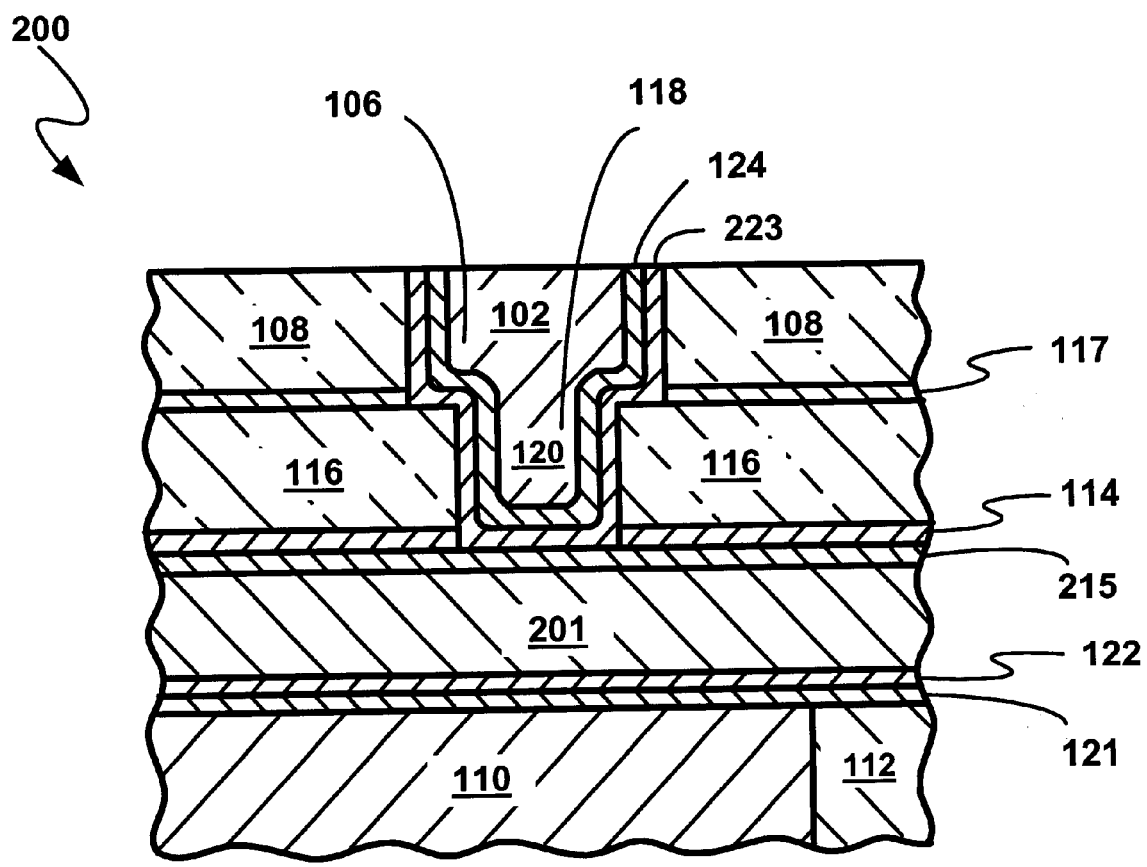
FIG. 2 is a simplified cross-section of a partially processed semiconductor wafer formed in accordance with the present invention.

Referring now to FIG. 2, therein is shown the cross-section of a semiconductor wafer 200 with a pair of aligned semiconductor channels of a conductive material such as aluminum, or copper formed in accordance with the present invention. For convenience of illustration, like numerals are used in FIG. 2 to denote like elements already described in FIG. 1A (PRIOR ART) and FIG. 1B (PRIOR ART). FIG. 2 is identical to FIG. 1B except that in this preferred embodiment, the first and second channel 201 and 102 are in horizontal planes separated vertically by a titanium nitride layer 215, a stop nitride layer 114, a via oxide layer 116, and a thin via nitride layer 117. Furthermore, barrier layer 223 comprises titanium, tantalum, titanium nitride, tantalum nitride, tungsten nitride, alloys thereof and combinations thereof.

If the first conductive material is aluminum, then barrier layer 223 should preferably be a first barrier layer (not shown) formed of titanium, tantalum, or a combination thereof, and a second barrier layer (not shown) formed of titanium nitride, tantalum nitride, tungsten nitride, or a combination thereof. The first barrier layer is disposed over the titanium nitride layer 215 and coats the walls 109, shown in FIG. 1A (PRIOR ART), of the second channel dielectric 108. The second barrier layer is disposed over the first barrier layer.

In production, a conventional first damascene process is used to put down over a production semiconductor wafer 100 a first channel 201 in a first channel oxide layer (not shown) above portions of a semiconductor device (not shown). The damascene process is a photolithographic process which uses a mask to define a first channel opening (not shown) in the first channel oxide layer. The first channel opening is then filled with the thin barrier layer 121, the thin seed layer 122, and the first conductive material, such as copper, to form the first channel 201 using conventional metal deposition techniques, such as physical vapor deposition, chemical vapor deposition, electroplating, or a combination thereof. The top surface would then be subject to chemical-mechanical polishing (CMP).

When the first conductive material is aluminum, an alternative approach may be used. Instead of forming a first channel of the first conductive material, an aluminum interconnect (not shown) may be formed by a blanket deposition of an aluminum layer atop the semiconductor wafer 100 using conventional metal deposition techniques such as physical vapor deposition, chemical vapor deposition, or a combination thereof, followed by a conventional patterning and etching of the aluminum layer to form the aluminum interconnect. A layer of dielectric is then deposited over the entire surface of the semiconductor wafer 200. The top surface of the dielectric layer would then be subject to CMP.

Next, the titanium nitride layer 215 is deposited over the top of the first channel 201 (or the aluminum interconnect as the case may be).

For the second channel 102, the stop nitride layer 114, the via oxide layer 116, and the via nitride layer 117 would be successively deposited on top of the titanium nitride layer 215 and the first channel oxide layer (not shown) using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 102 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the titanium nitride layer 215 and completes the etching steps. The second channel opening 106 is then filled with the thin barrier layer 223, the thin seed layer 124, and the second conductive material. The second conductive material is also a conductor, such as copper, to form the second channel 102 using conventional metal deposition techniques, such as physical vapor deposition, chemical vapor deposition, electroplating, or a combination thereof. A CMP process is used to level the second channel 102 to form the structure shown in FIG. 2.

The combination of the titanium nitride layer 215 and the barrier layer 223 provides a superior barrier for conductive material layers, such as copper/copper layers and copper/aluminum layers. There will be much lower diffusivity of copper and aluminum between copper/copper layers and copper/aluminum, and the electromigration resistance of the copper channels is improved.

While the best mode utilizes aluminum and copper as examples of the first conductive materials and copper as the second conductive material, it should be understood that the present invention is applicable to conductive materials such as copper, aluminum, doped polysilicon, gold, silver, compounds thereof, alloys thereof, and combinations thereof.

Further, although the embodiments of the present invention are primarily directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device, comprising:
   a semiconductor wafer;
   a first dielectric layer formed over the semiconductor wafer and having an opening provided therein, wherein said first dielectric layer overlays a region on said semiconductor wafer, said opening defined by walls of said first dielectric layer and exposing a portion of said region on said semiconductor wafer;
   a first barrier layer formed over said dielectric layer and coating said opening including along said walls, said first barrier layer formed to a thickness insufficient to fill said openings;
   a first conductive material layer in contact with said first barrier layer, said first conductive material layer substantially filling said opening;
   a second barrier layer formed over said first conductive material layer;
   a dielectric stop layer formed over the second barrier layer;
   a second dielectric layer formed over the stop layer and the second barrier layer, said second dielectric layer having an opening provided therein, said opening defined by walls of said second dielectric layer and open to the second barrier layer;
   a third barrier layer formed over said second barrier layer and said second dielectric layer and coating said opening, including along said walls, said barrier layer formed to a thickness insufficient to fill said opening; and
   a second conductive material layer in contact with said third barrier layer, said second conductive material layer substantially filling said opening.

2. The semiconductor device as claim in claim 1 wherein said barrier layers comprise a material selected from a group consisting of titanium, tantalum, tantalum nitride, tungsten nitride, and a combination thereof.

3. The semiconductor device as claimed in claim 1 wherein said second conductive material layer comprises a material selected from a group consisting of copper, gold, silver, an alloy thereof, and a combination thereof.

4. The semiconductor device as claimed in claim 1 further comprising a seed layer formed over said barrier layer and coating said barrier layer, said seed layer formed to a thickness insufficient to fill said opening.

5. The semiconductor device as claimed in claim 4 wherein said seed layer comprises a material selected from a group consisting of copper, gold, silver, an alloy thereof, and a combination thereof.

6. The semiconductor device as claimed in claim 1 wherein said first conductive material layer comprises a material selected from a group consisting of aluminum, copper, an alloy thereof, and a combination thereof.

* * * * *